United States Patent
Dhuyvetter et al.

(10) Patent No.: US 7,701,731 B2
(45) Date of Patent: Apr. 20, 2010

(54) SIGNAL COMMUNICATION ACROSS AN ISOLATION BARRIER

(75) Inventors: Timothy A. Dhuyvetter, Arnold, CA (US); Sajol Ghoshal, El Dorado Hills, CA (US)

(73) Assignee: Akros Silicon Inc., Folsom, CA (US)

( * ) Notice: Subject to any disclaimer, the term of this patent is extended or adjusted under 35 U.S.C. 154(b) by 482 days.

(21) Appl. No.: 11/674,395

(22) Filed: Feb. 13, 2007

(65) Prior Publication Data

US 2008/0191685 A1 Aug. 14, 2008

(51) Int. Cl.
H02M 3/335 (2006.01)
(52) U.S. Cl. .................................................. 363/16
(58) Field of Classification Search ................. 324/118; 363/16, 17, 97, 98, 132, 147; 455/69
See application file for complete search history.

(56) References Cited

U.S. PATENT DOCUMENTS

| | | | |
|---|---|---|---|
| 4,748,419 A | 5/1988 | Somerville | |
| 4,757,528 A | 7/1988 | Falater et al. | |
| 5,666,279 A * | 9/1997 | Takehara et al. | 363/95 |
| 5,701,037 A | 12/1997 | Weber et al. | |
| 5,818,112 A | 10/1998 | Weber et al. | |
| 5,952,849 A | 9/1999 | Haigh | |
| 6,124,756 A | 9/2000 | Yaklin et al. | |
| 6,147,542 A | 11/2000 | Yaklin | |
| 6,182,172 B1 | 1/2001 | Schwan | |
| 6,249,171 B1 | 6/2001 | Yaklin et al. | |
| 6,407,432 B1 | 6/2002 | Nemoto et al. | |
| 6,525,566 B2 | 2/2003 | Haigh et al. | |
| 6,563,718 B1 * | 5/2003 | Li et al. | 363/16 |
| 6,603,807 B1 | 8/2003 | Yukutake et al. | |
| 7,005,835 B2 * | 2/2006 | Brooks et al. | 323/282 |
| 7,064,442 B1 | 6/2006 | Lane et al. | |
| 7,075,329 B2 | 7/2006 | Chen et al. | |
| 7,116,565 B1 * | 10/2006 | Yang | 363/24 |
| 7,193,864 B2 * | 3/2007 | Hansson et al. | 363/16 |
| 2003/0174528 A1 * | 9/2003 | Wong et al. | 363/147 |
| 2005/0152080 A1 | 7/2005 | Harris et al. | |
| 2005/0167756 A1 | 8/2005 | Lotfi et al. | |
| 2005/0168203 A1 | 8/2005 | Dwarakanath et al. | |
| 2005/0169024 A1 | 8/2005 | Dwarakanath et al. | |
| 2005/0243496 A1 | 11/2005 | Harris | |
| 2005/0269657 A1 | 12/2005 | Dupuis | |
| 2005/0271147 A1 | 12/2005 | Dupuis | |
| 2005/0271148 A1 | 12/2005 | Dupuis | |
| 2005/0271149 A1 | 12/2005 | Dupuis | |
| 2005/0272378 A1 | 12/2005 | Dupuis | |
| 2005/0288799 A1 | 12/2005 | Brewer et al. | |
| 2006/0098363 A1 | 5/2006 | Hebert et al. | |
| 2006/0098364 A1 | 5/2006 | Harris et al. | |
| 2006/0098373 A1 | 5/2006 | Hebert et al. | |
| 2006/0176638 A1 | 8/2006 | Coates | |

\* cited by examiner

*Primary Examiner*—Adolf Berhance
*Assistant Examiner*—Yemane Mehari

(57) ABSTRACT

A method for transmitting an information signal across an isolation barrier comprises receiving an input signal, preconditioning the input signal according to a modulation function, passing the preconditioned signal through the isolation barrier, and recovering the passed signal according to a demodulation function corresponding to the modulation function, the recovered signal being operative as a feedback signal.

32 Claims, 12 Drawing Sheets

SIGNAL COMMUNICATION ACROSS AN ISOLATION BARRIER

BACKGROUND

Various communications, medical, computing, industrial, and other systems implement isolation barriers to electrically isolate sections of electronic circuitry. An isolator is a device that can transfer a signal between sections of electronic circuitry while maintaining electrical isolation between the sections.

A typical conventional design attains isolation, for example, by connecting to a communication channel through a transformer. The transformer provides isolation both for surge and galvanic isolation. Power can be transmitted on the line through the transformer.

SUMMARY

According to an embodiment of a network system, a method for transmitting an information signal across an isolation barrier comprises receiving an input signal, preconditioning the input signal according to a modulation function, passing the preconditioned signal through the isolation barrier, and recovering the passed signal according to a demodulation function corresponding to the modulation function, the recovered signal being operative as a feedback signal.

BRIEF DESCRIPTION OF THE DRAWINGS

Embodiments of the invention relating to both structure and method of operation may best be understood by referring to the following description and accompanying drawings.

DETAILED DESCRIPTION

Figure 1:
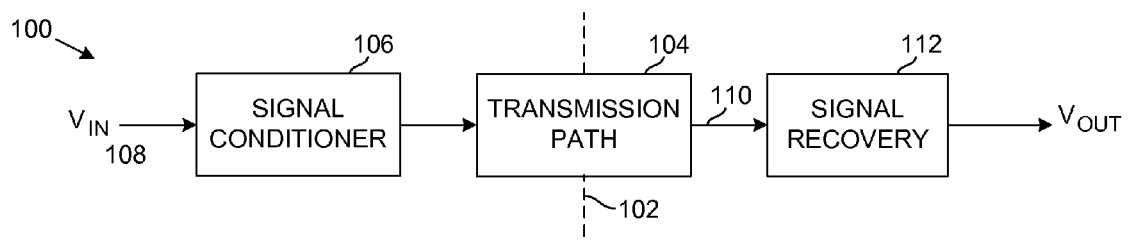
FIG. 1 is a schematic block diagram illustrating an embodiment of a signal isolator that enables a general analog transmission isolation method over an isolation barrier.

Referring to FIG. 1, a schematic block diagram illustrates an embodiment of a signal isolator 100 that enables a general analog transmission isolation method over an isolation barrier 102. The signal isolator 100 comprises a transmission path 104 forming the isolation barrier 102 and a signal conditioner 106 that is adapted to receive an input signal 108 and precondition the input signal 108 according to a modulation function to generate and pass a preconditioned signal 110 via the transmission path 104. A signal recovery circuit 112 that receives the preconditioned signal 110 via the transmission path 104 and demodulates the preconditioned signal 110, forming a feedback signal for usage in a control loop.

The signal conditioner 106 receives an input signal Vm that is passed through the transmission path 104 and isolation barrier to the signal recovery circuit 112 that generates the output signal Vout. The signal conditioner 106 can be any suitable circuit such as an analog-to-digital converter (ADC), a predriver that performs preconditioning, a simple flip-flop, digital-to-analog converter (DAC), or other device.

The signal isolator 100 can be configured to acquire an analog input signal, digitize the signal, and pass the digitized signal through a control system. The signal conditioner 106 can be any suitable modulator device such as a pulse width modulator, a delta modulator, a frequency modulator, and a phase modulator. For example, in a particular embodiment, the signal conditioner 106 can comprise an analog to digital converter that performs a modulation function, the transmission path 104 can comprise one or more capacitors, and the signal recovery circuit 112 can comprise a digital to analog converter or digital filter.

A synchronized recovery signal is passed through a digital path 104.

The illustrative signal isolator 100 depicts a general isolation scheme that be used for any kind of transmission, either analog or digital transmission, and forms an isolation barrier by operation of three functional blocks that perform signal conditioning, a transmission path and isolation barrier, and recovery.

The transmission path 104 can be considered to be a digital transmission path that communicates inherently digital signals. In another perspective, the transmission path 104 can pass a digital signal in which information is conveyed in an analog format with pulses passed through the path 104, for example through a capacitor, in characteristics of the signal such as frequency, phase, modulation index, or other attribute.

In a signal isolator implementation that inserts a sampling function in the pathway, an analog signal is converted to a digital form in which each sample has an associated digital value due to quantization of the original signal through the sampling function. The signal recovery circuit 112 can perform the sampling function to attain the digital signal by pulse modulation or other suitable type of general sampling conversion.

Other implementations can include a true analog signal, for example a direct current (DC) feedback voltage that is modulated and passes information through the transmission path 104, such as a capacitor, by oversampling and modulating up to a higher frequency, then using low pass filtering to recover the analog signal.

Figure 2:
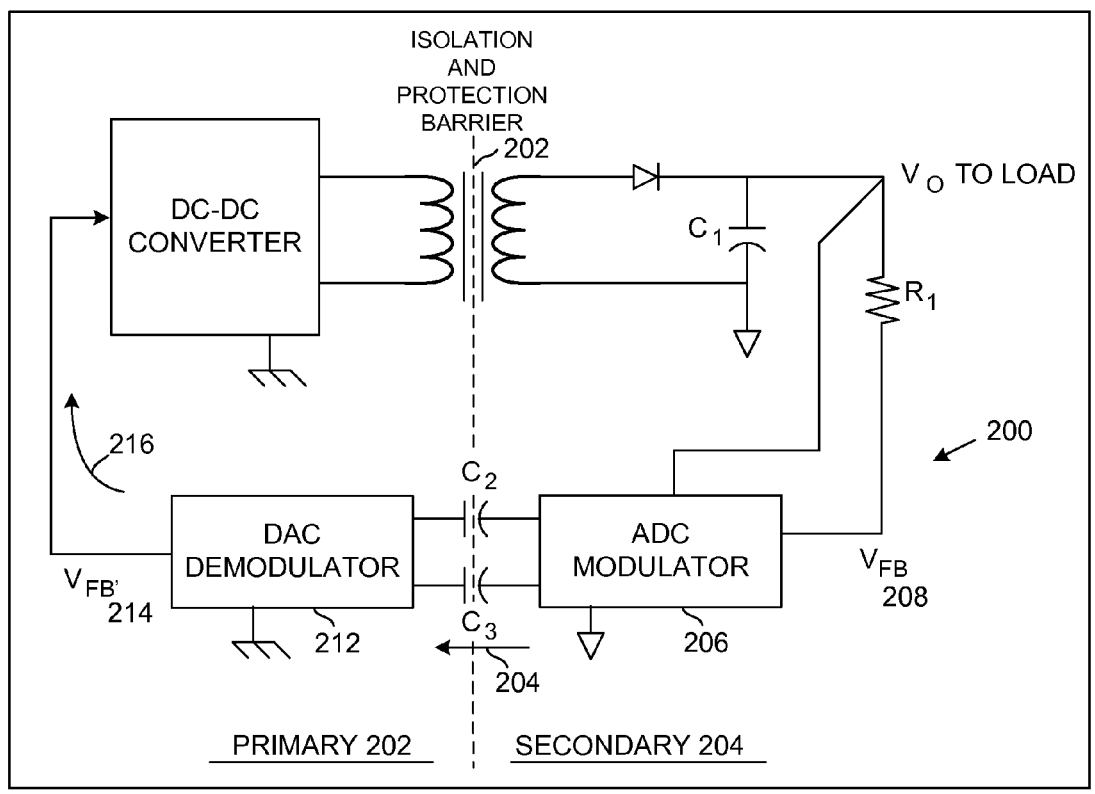
FIG. 2 is a schematic block and circuit diagram showing an embodiment of an isolator circuit that uses capacitors to couple a feedback signal across an isolation barrier.

Referring to FIG. 2, a schematic block and circuit diagram illustrates an embodiment of an isolator circuit 200 that uses capacitors to couple a feedback signal across an isolation barrier 202. The illustrative isolator circuit 200 comprises an isolated transmission path 204 and a modulator 206 configured to receive an input signal 208 that conditions the signal for transmission via the isolated transmission path 204. A demodulator 212 that receives the transmitted signal and recovers a feedback signal 214 for usage in a control loop 216.

In various implementations, the modulator 206 can be selected from among suitable modulators such as an analog-to-digital converter (ADC); a pulse code modulator, a delta modulator, a voltage to frequency converter, a frequency modulator, a phase modulator, or other appropriate device. A modulator 206 that is an analog-to-digital converter can be a single-ended analog-to-digital converter (ADC) modulator, a differential ADC modulator, a capacitively-coupled ADC modulator, or the like.

The modulator 206 can be constructed as an analog-to-digital converter (ADC) that performs any appropriate modulation such as delta modulation or pulse width modulation to convert a voltage signal to a pulse width signal, frequency modulation to convert the voltage signal to frequency, and a phase modulator to convert the voltage signal to a phase. If the ADC is implemented as a pulse width modulator or delta modulator, the corresponding demodulator 212 is typically constructed as a low pass filter with frequency modulation constant.

The illustrative transmission path 204 is implemented as a pair of capacitors with differential capacitor coupling. In other embodiments, the isolated transmission path can be constructed as one or more capacitors such as with single capacitor coupling, or can be constructed using other devices such as transformers, optical isolators, thermal isolating elements, or others.

The illustrative demodulator 212 is implemented as a digital-to-analog converter (DAC).

A specific example of an isolation circuit 200 including an ADC modulator 206 or other modulation scheme such as a pulse code modulator, delta modulator, voltage to frequency conversion modulator, an isolated transmission path 204, and a DAC demodulator 212 can be a class D amplifier that receives and modulates an input signal such as an audio signal, and drives a speaker by passing the signal through a capacitor.

The illustrative isolation circuit 200 uses a capacitor, such as a high voltage capacitor, to couple a feedback signal across an isolation barrier. A DC feedback signal is sampled at high frequency or modulated on a secondary side, passed through a coupling capacitor, and demodulated on the primary side.

Figure 3:
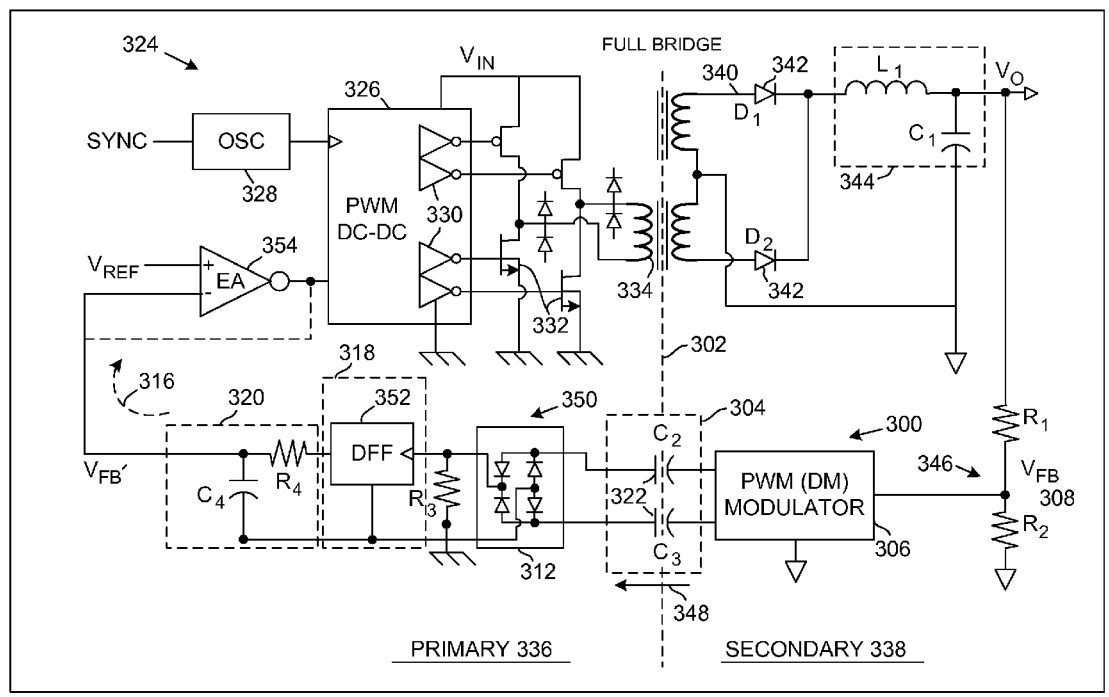
FIG. 3 is a schematic combined block and circuit diagram that illustrates an embodiment of a signal isolator.

Referring to FIG. 3, a schematic combined block and circuit diagram illustrates an embodiment of a signal isolator 300. The signal isolator 300 comprises a modulator 306 configured to receive and modulate a signal, a rectifier 312, and a full differential alternating current (AC) coupling 304 that is configured for transmitting the modulated signal from the modulator 306 to the rectifier 312 with capacitive-coupled signal isolation. A digital filter 318 coupled to the rectifier 312 that recovers the modulated signal.

In the illustrative embodiment, a lowpass filter 320 can be coupled to the digital filter 318. The lowpass filter restores an analog signal.

The signal isolator 300 can be configured to modulate a direct current (DC) feedback voltage and pass the DC feedback voltage through one or more capacitors 322 by oversampling and demodulating to a higher frequency.

FIG. 3 shows a general transmission pathway 304 over an isolation barrier 302. The transmission pathway 304 can be either an analog or digital pathway. A signal $V_{FB}$ is applied to a signal conditioner 306 and then to a transmission link 304 including the isolation barrier 302. The signal is then passed through a signal recovery block 312.

The illustrative circuit 300 comprises a pulse width (PWM) or delta DM) modulator 306, full differential alternating current (AC) coupling 304, and a diode bridge rectifier 312, for example implemented as digital flip-flop lowpass filter 320. In an analog path, direct current (DC) feedback voltage is modulated and passed through the capacitor 322 by oversampling and demodulating up to higher frequency, then low pass filtered to restore analog signal.

In an example embodiment, the transmission pathway 304 can be a feedback pathway, for example a digitized form of feedback that forms a control loop 316. A feedback signal is passed through a modulation function, then the transmission pathway 304 for example passed through one or two capacitors, and through a demodulation of the modulation function. In various implementations, the modulation can be pulse width modulation, delta modulation, frequency modulation, phase modulation, or the like. In a general functional description, an analog input signal can be input to the transmission pathway, digitized, and then passed as a digitized signal through a control loop.

FIG. 3 illustrates a power distribution system 324 that includes a signal isolator 300. An illustrative DC-DC converter 326 in the power distribution system 324 has a time base supplied by an oscillator 328 and includes internal drivers 330 and power field effect transistors (FETs) 332 that are shown external to DC-DC converter 326 but can be internal to the converter in some configurations. As shown, the DC-DC converter 326 can be a pulse width modulator (PWM) converter. The drivers 330 and power FETs 332 drive a transformer 334 and pass power from the primary side 336 to the secondary side 338 through the transformer 334 to a rectifier 340 that is depicted as diodes 342. In other configurations, the rectifier 340 can take other forms such as transmission gates or other devices for which a signal is used to drive the gates or devices on a communication pathway that is omitted in FIG. 3.

Following the diodes 342 is a filter 344 with an inductor L1 and a capacitor $C_1$ that passes an output voltage $V_O$. The output voltage $V_O$ is applied to a resistor divider 346 that forms a feedback voltage $V_{FB}$ and is returned on a feedback pathway 348 by application to a modulator 306, for example a pulse width modulator or a delta modulator. The feedback pathway 348 passes the feedback signal from the secondary side 338 to the primary side 336 across the isolation barrier 302, illustratively by differentially coupling the signal, although a single-ended embodiment can also be formed. Information, including feedback information, is passed from the modulator 306 over the differential capacitors 322 to the primary side 336 where the modulated signal is demodulated. The demodulation has a low pass filtering functionality and is illustratively implemented in a recovery circuit 350 that includes diodes in a diode bridge rectifier 312, a resistor R3, and a D flip-flop 352. The recovered feedback signal can be passed through a lowpass filter 320 which can be a first-order, second-order, or other suitable lowpass filter. The recovered feedback signal $V_{FB}$ following the lowpass filter 320 is applied to an error amplifier (EA) 354 and passed back to the DC-DC converter 326. The feedback voltage $V_{FB}$ is thus returned to the primary side 336 as recovered feedback signal $V_{FB}$ and can be passed to the DC-DC converter 326 either through the error amplifier (EA) 354 or directly in some implementations, depending on whether the error amplifier 354 is placed on the primary side 336 or the secondary side 338, or whether functionality is supplied by other circuits in the feedback pathway 348. For example, the error function can be supplied via the illustrative digital (D) flip-flop, which is a positive-edge flip-flop that can perform the error function.

In an example operation of error amplifier functionality, the feedback voltage from 0 to a selected value has a linear transformation so that PWM modulator 306 has a 0 to 100% duty cycle. The frequency does not change as the signal traverses the whole feedback path 348 and information is contained in the duty cycle. For example, if full scale on the secondary side is 1 volt, then 100% would be 1 volt, 50% would be half volt, and 0% would be zero volts. The transformation and recovery reduces the same voltage at feedback voltage $V_{FB}$ with some scale factor K that is arbitrarily chosen. For the selected gain or scale factor, the PWM circuitry uses the factor to set a servo value for the output signal to a predetermined fixed value.

Figure 4A:
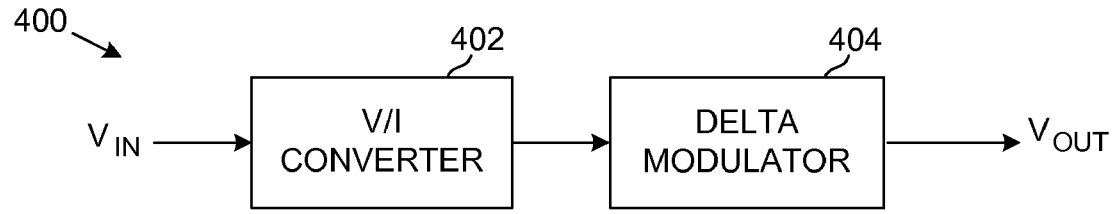
FIGS. 4A, 4B, and 4C illustrate a block diagram and circuit diagrams showing an example of an embodiment of a pulse width modulator that can be used in the illustrative signal isolators.
Figure 4B:
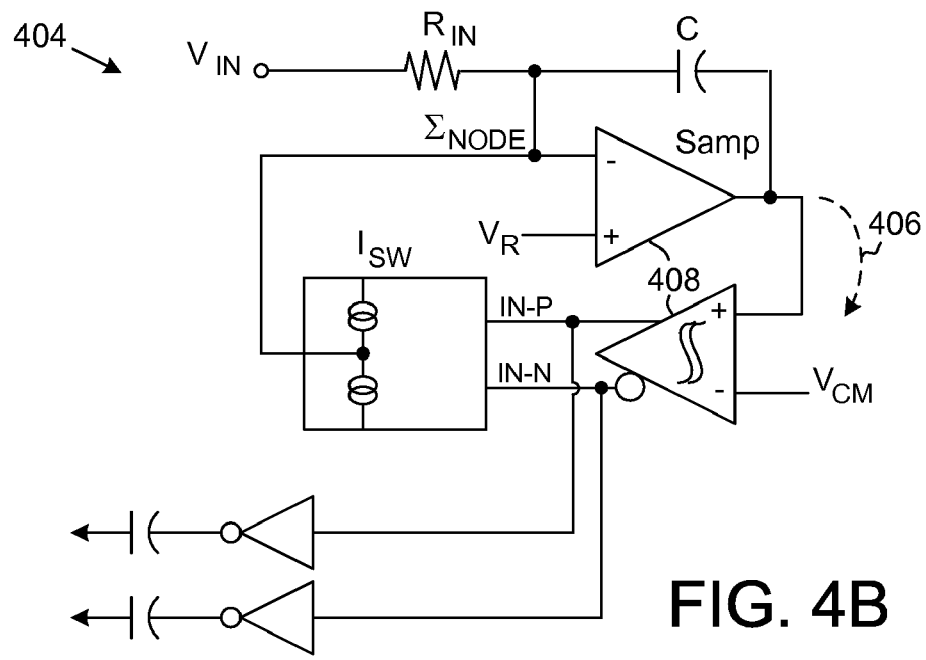
Figure 4C:
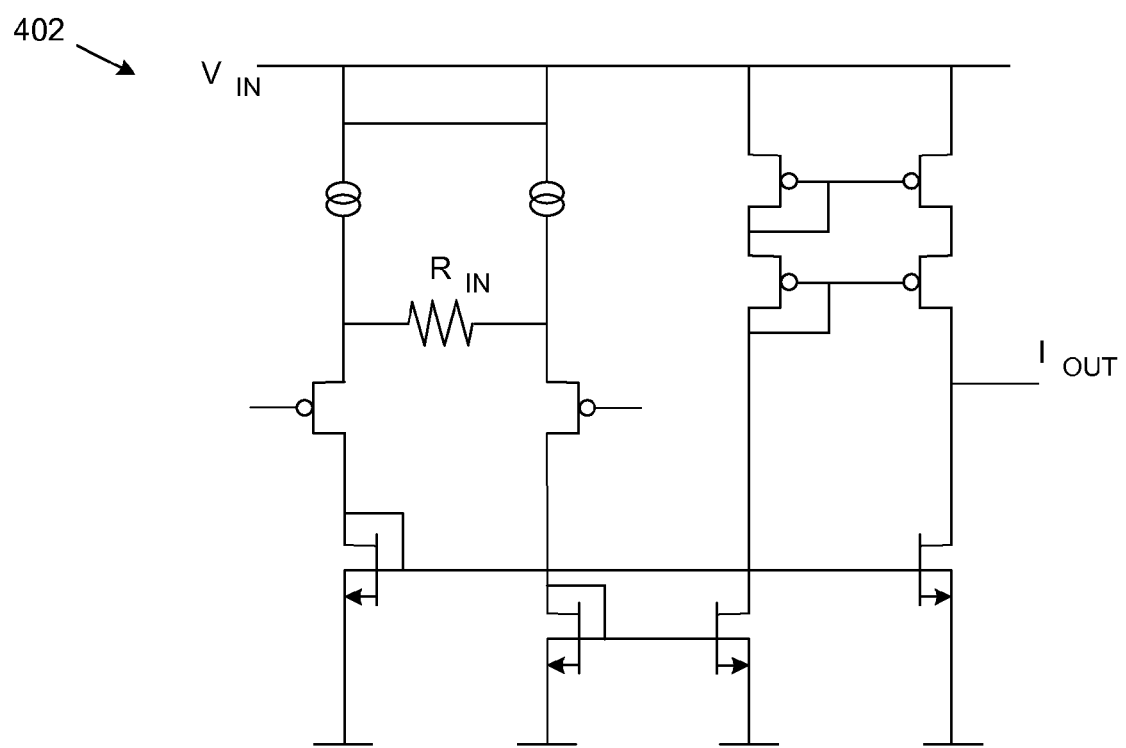

Referring to FIG. 4A, a schematic block diagram shows an example of an embodiment of a pulse width modulator 400 that can be used in the signal isolators. Modulation can be implemented using techniques other than pulse width modulation and pulse with modulation can be implemented in many other forms. An input voltage $V_{IN}$ is applied to a voltage to current converter 402 and passed to a delta modulator 404 to product a digital signal $D_O$. FIG. 4B shows an example implementation of the delta modulator 404. FIG. 4C illustrates an example implementation of the voltage to current converter 402.

Referring to FIG. 4B, the illustrative delta modulator 402 has a self-oscillatory signal loop or hysteretic oscillation loop 406 and performs simultaneous frequency derivation and pulse width modulation. The delta modulator 402 uses a dual set of comparators 408 coupled into the oscillatory signal loop 406. The comparator 408 in the feedback portion of the loop 406 supplies two clock signals which are switched and passed back to the comparator 408 in the input portion of the loop. Other embodiments of a delta modulator can include a fixed clock in place of the feedback loop. In another implementation, a clock signal can be driven as an input signal to produce a pulse width modulation output signal.

FIG. 4C illustrates an embodiment of a voltage to current converter 402 that can be used in the pulse width modulator 400.

Referring to FIGS. 5A, 5B, 5C, and 5D, a set of combined block and circuit diagrams depict several circuits and associated methods for transmitting an analog signal across an isolation boundary. Capacitive isolation generally can be used for passing alternative current (AC) or pulsed signals.

Figure 5A:
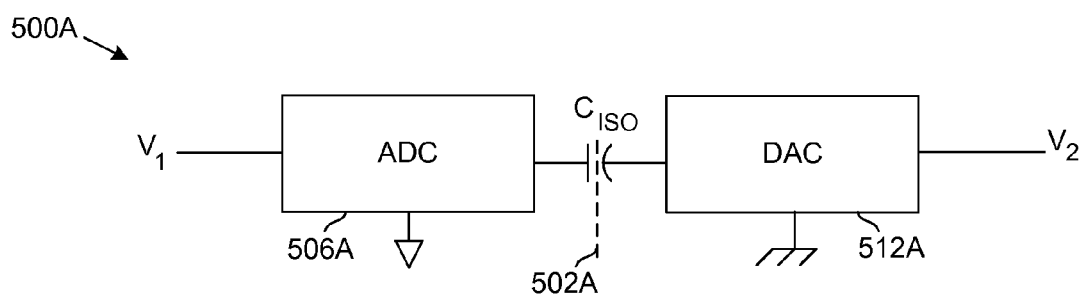
FIGS. 5A, 5B, 5C, and 5D is a set of combined block and circuit diagrams depicting several circuits and associated methods for transmitting an analog signal across an isolation boundary.

FIG. 5A shows an embodiment with a generalized structure and form for transmitting an analog signal. An isolator circuit 500A includes an analog to digital converter (ADC) 506A that receives an input voltage $V_I$ and converts the voltage signal to digital form for passage over an isolation barrier 502A to a digital to analog converter (DAC) 512A that converts the signal back to analog form as output voltage $V_O$. Two different symbols are depicted for ground indicating that the ground potential for the primary side and secondary side of the isolation barrier can be different. The analog to digital conversion can take many forms such as a pulse code modulation or other digitization. Conversion can be made from voltage to frequency, voltage to phase, voltage to pulse width, or other suitable parameters.

Figure 5B:
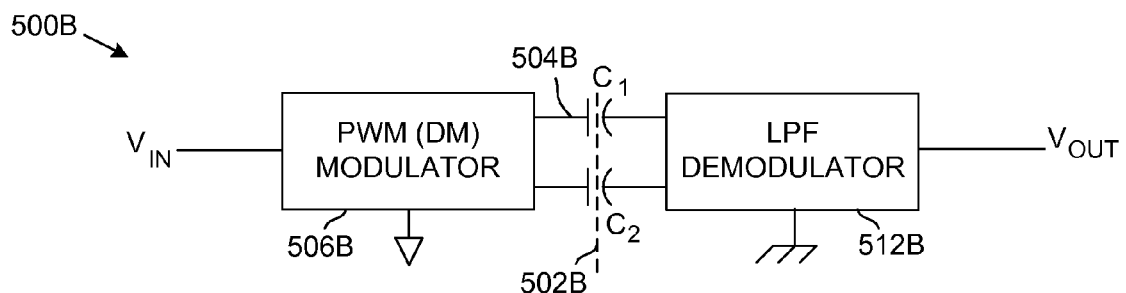

FIG. 5B depicts an embodiment of an isolator circuit 500B that comprises a pulse width modulator 506B that is configured to precondition a signal and a differential transmission isolation barrier 502B coupled to the pulse width modulator 506B that is configured to pass a preconditioned signal. A lowpass filter demodulator 512B is coupled to the differential transmission isolation barrier 502B and is configured to perform error recovery on the passed preconditioned signal.

The isolator circuit 500B includes a pathway 504B for transmitting an analog signal across an isolation barrier 502B wherein a voltage input signal $V_{IN}$ is applied to a pulse width (PWM) modulator 506B and passed across a capacitively-coupled differential transmission pathway 504B to a low pass filter demodulator 512B. The isolator circuit 500B includes a pulse width modulator (PWM) 506B, a differential transmission isolation barrier 502B, and a low pass filter (LPF) demodulator 512B. The PWM 506B is generally used for signal preconditioning. The LPF demodulator 512B can be used for error recovery.

Figure 5C:
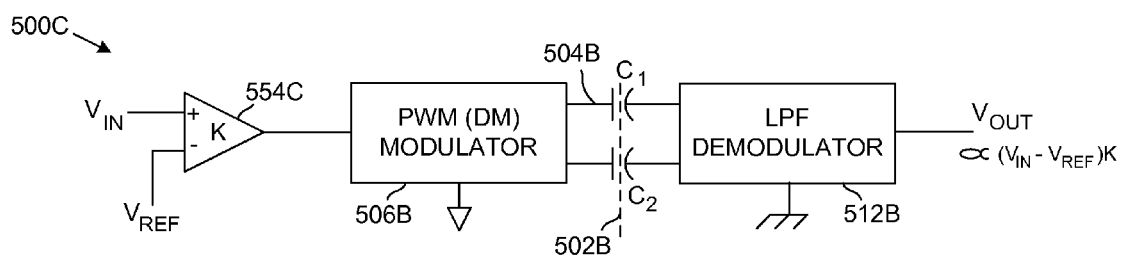

FIG. 5C shows an embodiment of an isolation circuit 500C that further comprises an error amplifier 554C coupled to a signal input terminal of the pulse width modulator 506B and is configured for comparing the signal to a reference. The isolation circuit 500C forms a pathway including preconditioning and error recovery with an error amplifier 554C on an input side for comparing an input voltage to a reference voltage, thereby generating an output voltage which is a K-function of the difference.

Figure 5D:
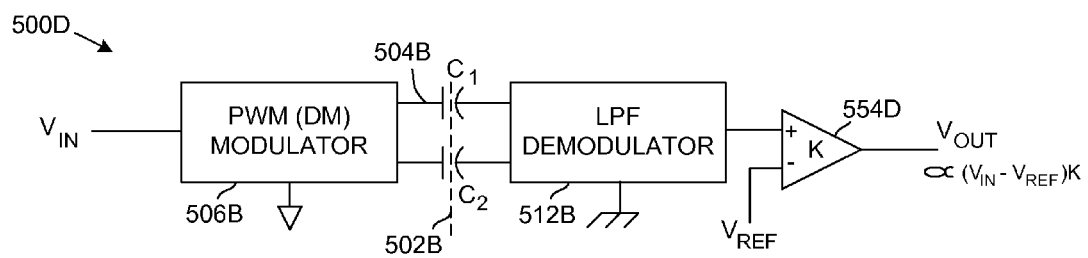

FIG. 5D illustrates an embodiment of an isolation circuit 500D further comprising an error amplifier 554D coupled to the lowpass filter modulator 506B that regulates the error recovered signal upon reconstruction. The isolation circuit 500D forms the pathway with the error function positioned after the signal is reconstructed. The error equation for the implementations shown in FIGS. 5C and 5D function according to the same basic equation. The error function is typically included in the pathway, although some embodiments may omit the function.

Figure 6A:
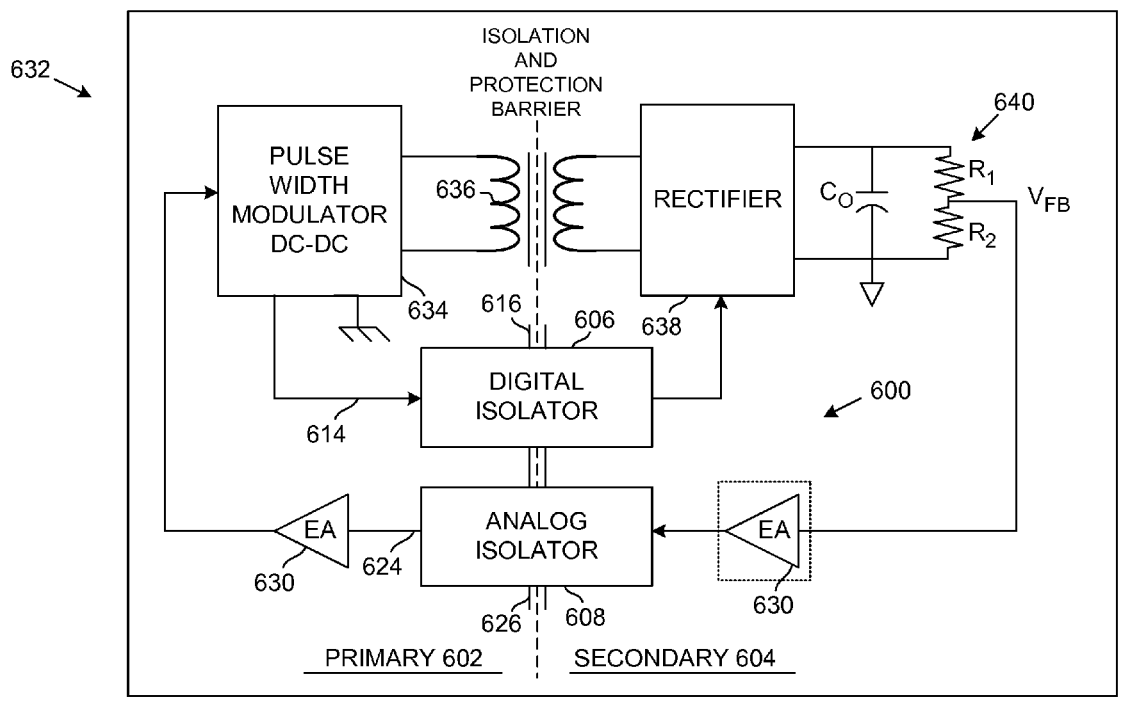
FIG. 6A is a combined block and circuit diagram illustrating an embodiment of a signal isolator configured as a dual-channel bidirectional isolator coupling a primary domain and a secondary domain.

Referring to FIG. 6A, a combined block and circuit diagram illustrates an embodiment of a signal isolator configured as a dual-channel bidirectional isolator 600 coupling a primary domain 602 and a secondary domain 604. The dual-channel bidirectional isolator 600 comprises a digital isolator 606 and an analog isolator 608 coupled in parallel between the primary domain 602 and the secondary domain 604 and configured to transmit data in opposing directions.

The digital isolator 606 can be configured to pass digital data transmission signals from the primary domain 602 to the secondary domain 604 and the analog isolator 608 can be configured to pass analog information back from the secondary domain 604 to the primary domain 602.

The digital isolator 606 passes digital information such as shut down, power-on-reset, status information, control information, and the like.

In some embodiments, the dual-channel bidirectional isolator 600 can further comprise an error amplifier 630 coupled to the dual-channel bidirectional isolator 600 at a primary domain connection or a secondary domain connection. The error amplifier 630 performs feedback regulation.

FIG. 6A depicts a power distribution system 632 including the signal isolator 600. The power distribution system 632 includes a DC-DC converter 634 with an isolated path 614, 624 for varied kinds of signal. The illustrative version of the signal isolator 600 includes digital signal isolation barrier transmission.

The illustrative power distribution system 632 shows a structure and associated technique for transmitting signals across an isolation barrier 616, 626. The DC-DC converter 634 in a primary domain 602 passes power to a transformer 636. The transformer 636 transfers power to a secondary domain 604 which includes a rectifier 638 and several discrete components. The rectifier 638 is a functional block that can perform rectification or signal conditioning in many ways. Signals are passed between the primary domain 602 and the secondary domain 604 in two communication pathways. The DC-DC converter 634 in the primary domain 602 passes a digital signal to the secondary domain 604 via a digital isolator 606. A feedback signal $V_{FB}$ is returned from the secondary domain 604 to the DC-DC converter 634 in the primary domain 602 over an isolating pathway that includes analog-to-digital conversion (ADC) 608. The ADC 608 can be implemented using a variety of different structures and functional methods. The ADC can be single-ended or differential, and can have capacitive-coupling.

Referring again to FIG. 6A, a return communication signal path from the secondary domain 604 to the primary domain 602 is also a transmission path incorporating an isolation barrier 602. The return transmission path can carry a feedback signal $V_{FB}$ back to the primary domain 602 and to the DC-DC converter 634. The return transmission pathway can include an error amplifier 630 which is shown on the primary domain 602 but can otherwise be positioned on the secondary domain 604, as shown in dotted lines. For an analog return signal pathway, the feedback signal $V_{FB}$ is used to control the power distribution system feedback loop. The feedback loop of the DC-DC converter 634 passes through the transformer 636, the rectifier 638, a capacitor $C_O$, a resistor divider 640, through the analog digital transmission path, and back into the DC-DC converter 634. The loop is a regulatory loop for regulating power distribution. The error amplifier 630 is included to complete the regulation functionality. Error amplifier functionality can be on either the primary domain 602 or the secondary domain 604 of the isolation barrier 602.

A signal from the DC-DC converter 634 is passed through the digital isolator 606 and into the rectifier 638 to enable synchronous rectification. The digital information pathway through the digital isolator 606 can carry various other information elements in addition to the rectification signal including shut down, enable, power on reset, or a variety of different types of different status or information data which is desired to be send back and forth between the primary domain 602 and the secondary domain 604.

The forward path is depicted as a DC-DC converter 634 but other types of paths can be formed. Some implementations can replace the transformer with another type of transmission path and isolation barrier, for example high voltage capacitors. Accordingly, some other type of power path can be implemented and controlled via a feedback loop. One of paths is a feedback path that transmits a digitized form of the feedback and forms a control loop. In various embodiments, the forward path and feedback path can form a servo loop or other type of digital path that can communicate in either direction across the isolation barrier.

The feedback signal is represented as a digital signal passing through a capacitor that is fed back to the DC-DC converter 634 for controlling power passed through the power isolation barrier from the primary domain 602 to the secondary domain 604.

Figure 6B:
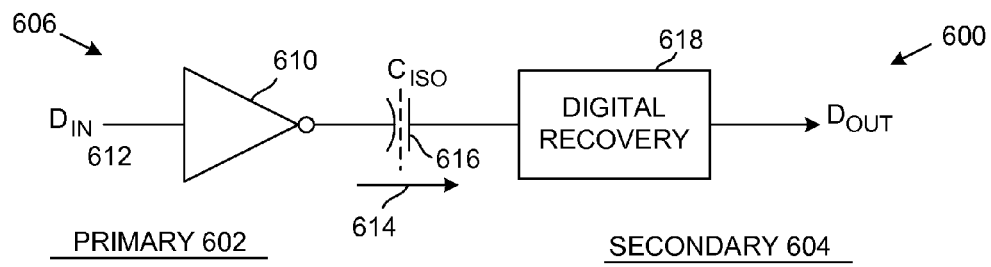
FIG. 6B is a block and circuit diagram showing an embodiment of a digital isolator that can be implemented in the isolator.

Referring to FIG. 6B, a block and circuit diagram shows an embodiment of a digital isolator 606 that can be implemented in the isolator 600. The digital isolator 606 comprises a pre-conditioner 610 adapted to receive an input signal 612 and precondition the input signal 612 using a modulation function and a transmission path 614 comprising an isolation barrier 616 coupled to the pre-conditioner 610 for passing a preconditioned signal. The digital isolator 606 can further comprise a digital recovery circuit 618 coupled to the transmission path 614.

The transmission path 614 is illustratively shown as an isolation barrier 616 formed by a capacitor $C_{ISO}$. The isolation barrier 616 can be constructed in a variety of forms such as a capacitive isolation barrier, an electrostatic isolation barrier, a transformer isolation barrier, a magnetic isolation barrier, an optical isolation barrier, a thermal isolation barrier, a resistive isolation barrier, a piezoelectric isolation barrier, or others.

The digital isolator 606 is shown as a digital transmission block with a dashed-line indicating the isolation boundary. One example of a component that can be implemented for passing data or other information across the boundary is a capacitor $C_{ISO}$. Accordingly, the digital isolator 606 can be configured as one or more capacitors although other embodiments can be any type of barrier transmission path. In various implementations the type of isolation and associated digital isolator can be electrostatic isolation as a capacitor, a magnetic isolation formed as a transformer, a light isolation formed as an optical isolator. Other techniques can also transmit information across the boundary using other effects such as thermal, resistive, or more unusual forms such as piezoelectric and the like. Accordingly, information data signals can be passed, for example as digital information, from the primary domain 602 to the secondary domain 604, and information that can include feedback signals is communicated back from the secondary domain 604 to the primary domain 602, usually as analog signals although some implementations can return digital signals.

Figure 6C:
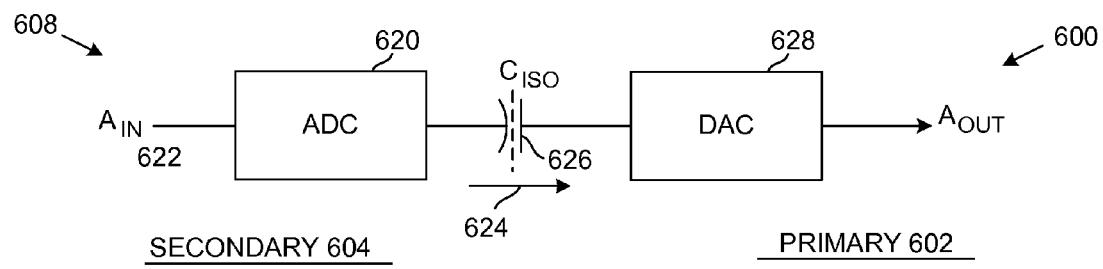
FIG. 6C is a block and circuit diagram showing an embodiment of an analog isolator that can be implemented in the isolator.

Referring to FIG. 6C, a block and circuit diagram shows an embodiment of an analog isolator 608 that can be implemented in the isolator 600. The analog isolator 608 can comprise an analog-to-digital converter (ADC) 620 adapted to receive and precondition a feedback signal 622 and a transmission path 624 comprising an isolation barrier 626 coupled to the ADC 620 for passing a preconditioned signal. The analog isolator 608 also comprises a digital-to-analog converter (DAC) 628 coupled to the transmission path 624.

The transmission path 624 is illustratively shown as an isolation barrier 626 formed by a capacitor $C_{ISO}$. In other embodiments, the isolation barrier 626 can be a capacitive isolation barrier, an electrostatic isolation barrier, a transformer isolation barrier, a magnetic isolation barrier, an optical isolation barrier, a thermal isolation barrier, a resistive isolation barrier, a piezoelectric isolation barrier, or the like.

In various embodiments, the analog-to-digital converter (ADC) 620 can be configured to convert, sample, and modulate and analog signal into digital format and pass the digital format signal through a capacitor $C_{ISO}$ in the transmission path 624. The digital-to-analog converter (DAC) 628 can be configured to recover the signal to a baseband analog signal.

FIGS. 6B and 6C can also show example embodiments of the digital isolator 606 depicted in FIG. 6A. FIG. 6B illustrates the digital isolator 606 in a form that receives a digital input signal and passes the digital signal to a driver 610 or other pre-conditioner. The preconditioned signal passes through an isolation capacitor $C_{ISO}$ to a digital recovery block 618 and then to a digital data output terminal.

FIG. 6C can also illustrate an analog signal implementation of the digital isolator 606. An analog signal path has an analog signal that is passed through an analog-to-digital converter (ADC) of some type. Many types of components or devices can be implemented to perform the conversion function to convert, sample, and modulate the analog signal into a digital format for passage through a transmission path with an isolation barrier, such as a capacitor. The digital signal passes to a signal recovery device or component such as a digital-to-analog converter (DAC) to return a base-band analog signal.

Figure 7:
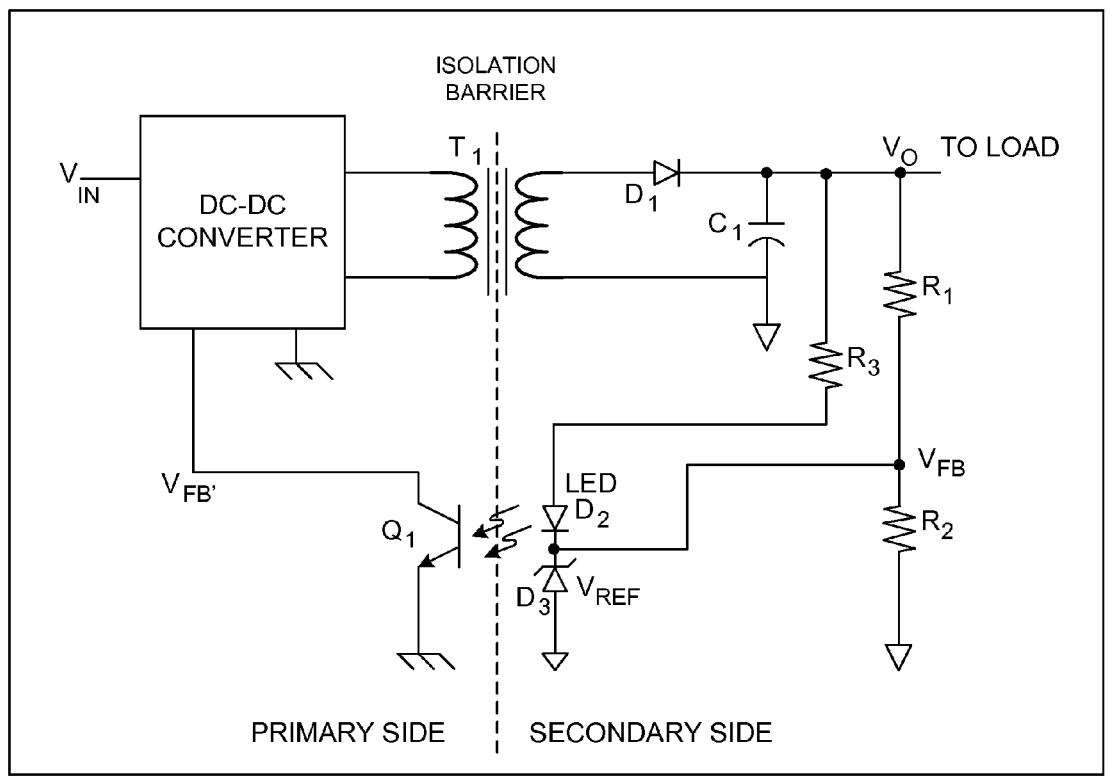
FIG. 7 is a schematic block diagram illustrating an embodiment of an isolated power converter that includes a DC-DC converter and optical coupler isolation.

Referring to FIG. 7, a schematic block diagram illustrates an embodiment of an isolated power converter that includes a DC-DC converter and optical coupler isolation. The power distribution circuit has an input supply voltage applied into the DC-DC converter, a transformer, a rectifying function include in the integration, and an opto-isolator for crossing the barrier with the information. An error function is formed on the secondary side as a light-emitting diode (LED) stacked on a voltage so the output feedback voltage is compared to an internal reference voltage and the difference of the comparison is represented by the current in the transistor Q1 which is labeled a feedback error signal.

In contrast, in the various embodiments shown in FIGS. 1 through 6, the feedback signal is passed through some type of modulation scheme, transmitted on a pathway that includes an isolation barrier, then passed to some type of demodulation. Any suitable type of modulation can be implemented, for example a simple analog-to-digital converter or other simple rectifier. The transmission pathway including an isolation barrier can be any suitable technology, for example one or more capacitors, or other technology. Generally, demodulation can be selected to suitably recover a signal according to the implemented type of modulation.

Modulation can be implemented in a variety of different ways, including but not limited to pulse width modulation (PWM), delta modulation (DM), frequency modulation (FM), phase modulation, and others. Modulation can be used to generate samples in any kind of sample system to produce a serial bit stream with information represented by packets. For example, in classic pulse code modulation, sampling can be implemented to form an eight-bit word so that packets of eight-bit words represent a sample.

In contrast, other embodiment may implement modulation in a form that is not a true sampled data system where the information is carried in a set number of bits like an eight-bit or other size word.

For example, an entire framed serial path can be embedded that transmits information as packets that may be 64-bits long and transmitted at 10 MHz or 100 MHz and used to control the feedback loop. Other information can also be communicated on the serial path, for example data or control information such as temperature issues, control signals for shutdown, or any other information that can be usefully passed.

A simpler implementation of the feedback path can convey in the feedback as a relative variation in feedback voltage end up, whether higher or lower, in a continuous analog approach.

In contrast to a power converter that uses optical techniques for isolation, the illustrative embodiments shown in FIGS. 1 through 6, can enable production of a circuit with the entire path formed in a single integrated circuit or within a single package. For example, isolation barriers formed using capacitors can be integrated into a single integrated circuit chip. In some implementations, the isolation barrier can be formed using magnetic inductors that can be implemented with the entire loop in a single package. Optical isolators cannot easily be integrated into a single package with the DC-DC converter because an optical isolator system includes three disparate components: a light emitting diode (LED), a phototransistor, and an error amplifier or reference, to perform communication with optical isolation alone. The embodiments shown in FIGS. 1 through 6 enable production of a realizable circuit in simple packaging and lower cost.

Figure 8A:
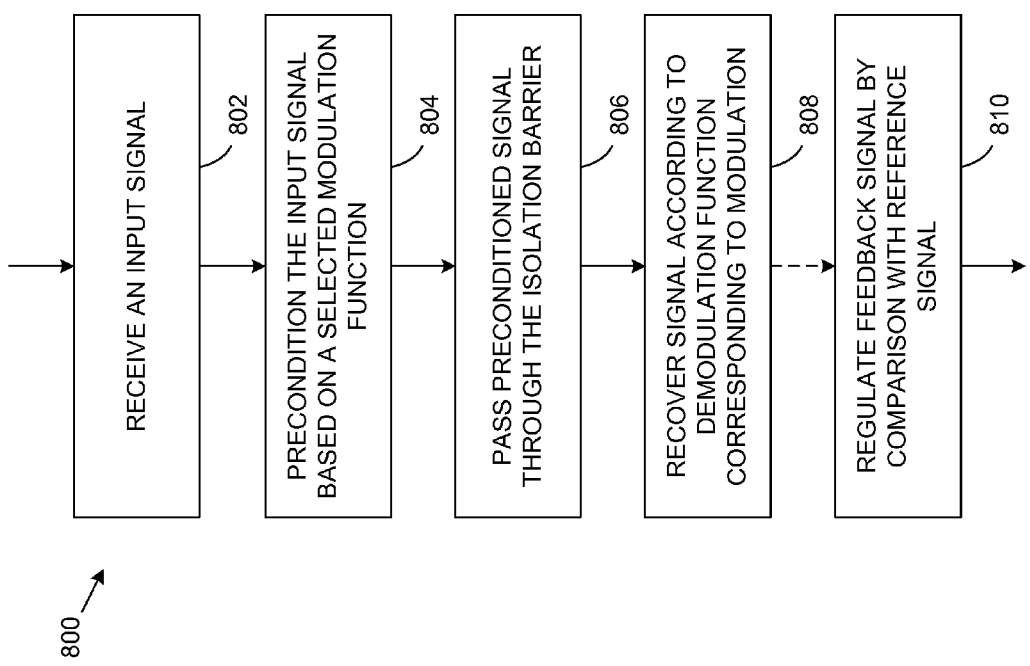
FIGS. 8A and 8B are a group of flow charts depicting aspects of methods that can be implemented individually or in combination in one or more embodiments for transmitting an information signal across an isolation barrier.
Figure 8B:
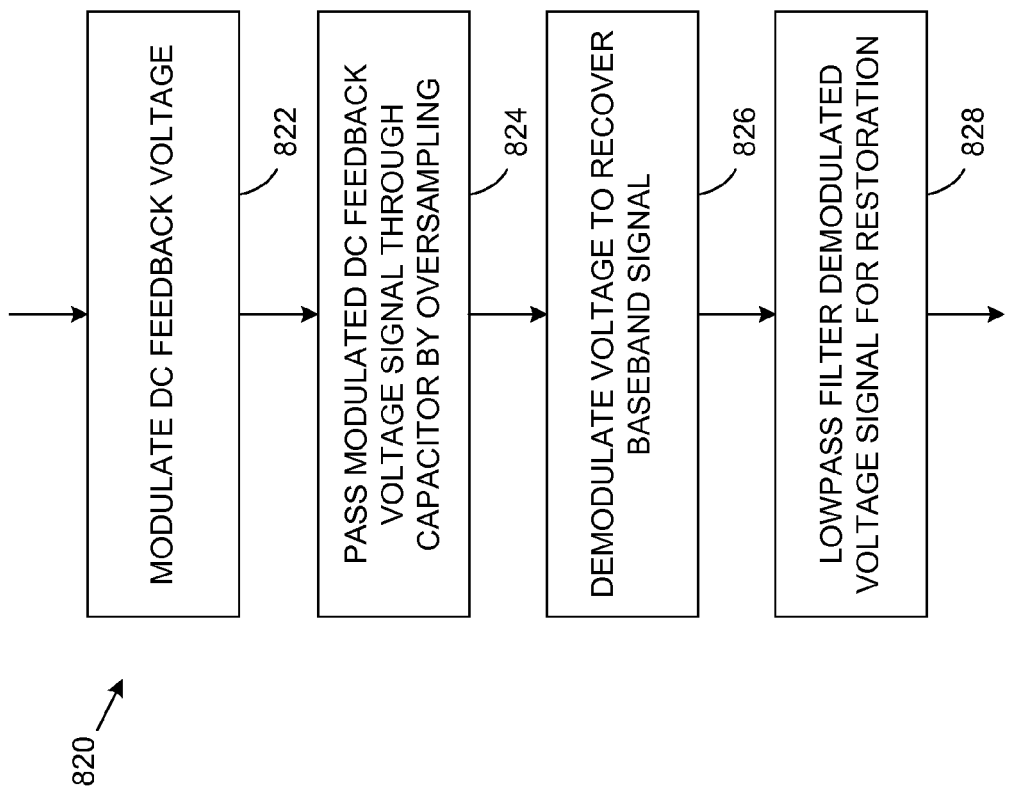

Referring to FIGS. 8A and 8B, a group of flow charts depict aspects of methods that can be implemented individually or in combination in one or more embodiments for transmitting an information signal across an isolation barrier. FIG. 8A shows a method 800 for transmitting a signal across an isolation barrier that comprises receiving 802 an input signal, preconditioning 804 the input signal based on a selected modulation function, and passing 806 the preconditioned signal through the isolation barrier. The method 800 further comprises recovering 808 the passed signal according to a demodulation function corresponding to the modulation function. The recovered signal is a feedback signal.

The illustrative technique for transmitting an analog signal across an isolation boundary fundamentally involves receiving an analog signal, digitizing the signal, and passing the digitized signal through a control system. Digitizing the signal can include some type of analog to digital conversion or a modulation scheme. The signal can be passed over an isolation capacitor to a digital to analog converter.

In various embodiments, preconditioning 804 the input signal can comprise converting the input signal from an analog signal to a digital signal based on a modulation function such as pulse width modulation, delta modulation, frequency modulation, and phase modulation.

The preconditioned signal can be passed 806 through an isolation barrier that can be a capacitive isolation barrier, an electrostatic isolation barrier, a transformer isolation barrier, a magnetic isolation barrier, an optical isolation barrier, a thermal isolation barrier, a resistive isolation barrier, a piezoelectric isolation barrier, or other suitable isolation barrier.

In various embodiments, the preconditioned signal can be passed 806 through a single-ended isolation barrier or a differential isolation barrier.

In some embodiments, the passed signal can be recovered 808 according to a bistable multivibrator operation, digital to analog conversion, or other suitable operation.

In some embodiments, the feedback signal can be regulated 810 by comparison with a reference signal.

Referring to FIG. 8B, another embodiment of a method 820 for transmitting an information signal across an isolation barrier is shown that comprises modulating 822 a direct current (DC) feedback voltage signal and passing 824 the modulated DC feedback voltage signal through a capacitor by oversampling. The passed voltage can be demodulated 826 to recover the baseband signal. The demodulated voltage signal can be lowpass filtered 828 to restore an analog signal.

Terms "substantially", "essentially", or "approximately", that may be used herein, relate to an industry-accepted tolerance to the corresponding term. Such an industry-accepted tolerance ranges from less than one percent to twenty percent and corresponds to, but is not limited to, component values, integrated circuit process variations, temperature variations, rise and fall times, and/or thermal noise. The term "coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. Inferred coupling, for example where one element is coupled to another element by inference, includes direct and indirect coupling between two elements in the same manner as "coupled".

While the present disclosure describes various embodiments, these embodiments are to be understood as illustrative and do not limit the claim scope. Many variations, modifications, additions and improvements of the described embodiments are possible. For example, those having ordinary skill in the art will readily implement the steps necessary to provide the structures and methods disclosed herein, and will understand that the process parameters, materials, and dimensions are given by way of example only. The parameters, materials, and dimensions can be varied to achieve the desired structure as well as modifications, which are within the scope of the claims. Variations and modifications of the embodiments disclosed herein may also be made while remaining within the scope of the following claims. For example, various aspects or portions of a communication or isolation system are described including several optional implementations for particular portions. Any suitable combination or permutation of the disclosed designs may be implemented.

What is claimed is:

1. A method for transmitting an information signal across an isolation barrier comprising:
   receiving an input signal;
   preconditioning the input signal according to a modulation function;
   passing the preconditioned signal through the isolation barrier wherein the preconditioned signal is a digital signal and information is conveyed in an analog format; and
   recovering the passed signal according to a demodulation function corresponding to the modulation function, the recovered signal being operative as a feedback signal.

2. The method according to claim 1 further comprising:
   preconditioning the input signal comprising converting the input signal from an analog signal to a digital signal according to a modulation function selected from a group consisting of pulse width modulation, delta modulation, frequency modulation, and phase modulation.

3. The method according to claim 1 further comprising:
   passing the preconditioned signal through the isolation barrier selected from a group consisting of a capacitive isolation barrier, an electrostatic isolation barrier, a transformer isolation barrier, a magnetic isolation barrier, an optical isolation barrier, a thermal isolation barrier, a resistive isolation barrier, and a piezoelectric isolation barrier; and
   conveying information in an analog format selected from a group consisting of frequency, phase, and modulation index.

4. The method according to claim 1 further comprising:
   passing the preconditioned signal through a single-ended isolation barrier or a differential isolation barrier.

5. The method according to claim 1 further comprising:
   recovering the passed signal according to a bistable multivibrator operation or digital to analog conversion.

6. The method according to claim 1 further comprising:
   modulating a direct current (DC) feedback voltage signal;
   passing the modulated DC feedback voltage signal through a capacitor by oversampling;
   demodulating the passed voltage whereby a baseband signal is recovered; and
   lowpass filtering the demodulated voltage signal to restore an analog signal.

7. The method according to claim 1 further comprising:
   regulating the feedback signal by comparison with a reference signal.

8. A signal isolator comprising:
   a transmission path comprising an isolation barrier;
   a signal conditioner adapted to receive an input signal and precondition the input signal according to a modulation function for passing a preconditioned signal via the transmission path; and
   a signal recovery circuit that receives the preconditioned signal via the transmission path and demodulates the preconditioned signal, forming a feedback signal for usage in a control loop, wherein the transmission path transmits the preconditioned signal as a digital signal wherein information is conveyed in an analog format from the signal conditioner to the signal recovery circuit.

9. The signal isolator according to claim 8 further comprising:
   the signal conditioner comprising an analog to digital converter that performs a modulation function;
   the transmission path comprising at least one capacitor; and
   the signal recovery circuit comprising a digital to analog converter or digital filter, wherein the signal isolator is implemented in a single integrated circuit.

10. The signal isolator according to claim 8 further comprising:
    the signal conditioner comprising a modulator selected from a group consisting of a pulse width modulator, a delta modulator, a frequency modulator, and a phase modulator; and
    information is conveyed in an analog format selected from a group consisting of frequency, phase, and modulation index.

11. The signal isolator according to claim 8 further comprising:
    the signal isolator configured to acquire an analog input signal, digitize the signal, and pass the digitized signal through a control system.

12. An isolator circuit comprising:
    an isolated transmission path;
    a modulator configured to receive an input signal that conditions the signal for transmission via the isolated transmission path; and
    a demodulator that receives the transmitted signal and recovers a feedback signal for usage in a control loop, wherein the isolated transmission path transmits the signal after conditioning as a digital signal wherein information is conveyed in an analog format from the modulator to the demodulator.

13. The isolator circuit according to claim 12 further comprising:
    the modulator selected from a group consisting of an analog-to-digital converter;
    a pulse code modulator, a delta modulator, a voltage to frequency converter, a frequency modulator, and a phase and
    information is conveyed in an analog format selected from a group consisting of frequency, phase, and modulation index.

14. The isolator circuit according to claim 12 further comprising:
    the modulator comprising a single-ended analog-to-digital converter (ADC) modulator, a differential ADC modulator, or a capacitively-coupled ADC modulator.

15. The isolator circuit according to claim 12 further comprising:
    the isolated transmission path comprises at least one capacitor, wherein the isolator circuit is implemented in a single integrated circuit.

16. The isolator circuit according to claim 12 further comprising:
    the demodulator comprising a digital-to-analog converter (DAC).

17. A signal isolator comprising:
    a modulator configured to receive and modulate a signal;
    a rectifier;
    full differential alternating current (AC) coupling configured for transmitting the modulated signal from the modulator to the rectifier with capacitive-coupled signal isolation; and
    a digital filter coupled to the rectifier and configured to recover the modulated signal, wherein the full differential AC coupling transmits the modulated signal as a digital signal wherein information is conveyed in an analog format from the modulator to the digital filter.

18. The signal isolator according to claim 17 further comprising:
a lowpass filter coupled to the digital filter.

19. The signal isolator according to claim 17 further comprising:
the signal isolator configured to modulate a direct current (DC) feedback voltage and pass the DC feedback voltage through at least one capacitor by oversampling and demodulating to a higher frequency, wherein the signal isolator is implemented in a single integrated circuit.

20. The signal isolator according to claim 17 further comprising:
a lowpass filter coupled to the digital filter; and
the signal isolator configured to modulate a direct current (DC) feedback voltage and pass the DC feedback voltage through at least one capacitor by oversampling and demodulating to a higher frequency, the lowpass filter configured to restore an analog signal.

21. An isolator circuit comprising:
a pulse width modulator configured to precondition a signal;
a differential transmission isolation barrier coupled to the pulse width modulator and configured to pass a preconditioned signal; and
a lowpass filter demodulator coupled to the differential transmission isolation barrier and configured to perform error recovery on the passed preconditioned signal, wherein the differential transmission isolation barrier transmits the preconditioned signal as a digital signal wherein information is conveyed in an analog format from the pulse width modulator to the lowpass filter demodulator.

22. The isolator circuit according to claim 21 further comprising:
an error amplifier coupled to a signal input terminal of the pulse width modulator and configured for comparing the signal to a reference wherein frequency is constant as a signal traverses the differential transmission isolation barrier and information is contained in duty cycle.

23. The isolator circuit according to claim 21 further comprising:
an error amplifier coupled to the lowpass filter modulator and configured for regulating the error recovered signal upon reconstruction.

24. A signal isolator comprising:
a dual-channel bidirectional isolator coupling a primary domain and a secondary domain wherein power is distributed from the primary domain to the secondary domain comprising:
a digital isolator and an analog isolator coupled in parallel between the primary domain and the secondary domain and configured to transmit data in opposing directions, the digital isolator passing a digital signal from the primary domain to the secondary domain that directly controls rectification of the distributed power.

25. The signal isolator according to claim 24 further comprising:
the digital isolator configured to pass digital data transmission signals from the primary domain to the secondary domain; and
the analog isolator configured to pass analog information back from the secondary domain to the primary domain.

26. The signal isolator according to claim 24 further comprising:
the digital isolator configured to pass digital information including shut down, power-on-reset, status information, and control information.

27. The signal isolator according to claim 24 further comprising:
the digital isolator comprising:
a pre-conditioner adapted to receive an input signal and precondition the input signal according to a modulation function;
a transmission path comprising an isolation barrier coupled to the pre-conditioner for passing a preconditioned signal; and
a digital recovery circuit coupled to the transmission path.

28. The signal isolator according to claim 24 further comprising:
the analog isolator comprising:
an analog-to-digital converter (ADC) adapted to receive a feedback signal and precondition the feedback signal;
a transmission path comprising an isolation barrier coupled to the ADC for passing a preconditioned signal; and
a digital-to-analog converter coupled to the transmission path.

29. The signal isolator according to claim 24 further comprising:
an error amplifier coupled to the dual-channel bidirectional isolator at a primary domain connection or a secondary domain connection and configured for feedback regulation wherein frequency is constant as a signal traverses the dual-channel bidirectional isolator and information is contained in duty cycle.

30. The signal isolator according to claim 27 further comprising:
the transmission path comprising an isolation barrier selected from a group consisting of a capacitive isolation barrier, an electrostatic isolation barrier, a transformer isolation barrier, a magnetic isolation barrier, an optical isolation barrier, a thermal isolation barrier, a resistive isolation barrier, and a piezoelectric isolation barrier.

31. The signal isolator according to claim 28 further comprising:
the transmission path comprising an isolation barrier selected from a group consisting of a capacitive isolation barrier, an electrostatic isolation barrier, a transformer isolation barrier, a magnetic isolation barrier, an optical isolation barrier, a thermal isolation barrier, a resistive isolation barrier, and a piezoelectric isolation barrier.

32. The signal isolator according to claim 28 further comprising:
the analog-to-digital converter configured to convert, sample, and modulate and analog signal into digital format and pass the digital format signal through a capacitor in the transmission path; and
the digital-to-analog converter configured to recover to a baseband analog signal, wherein the signal isolator is implemented in a single integrated circuit.

* * * * *